(12) United States Patent
Matsuura et al.

(10) Patent No.: US 6,275,394 B1
(45) Date of Patent: Aug. 14, 2001

(54) INPUT CIRCUIT

(75) Inventors: Kazushige Matsuura; Shinichi Kouzuma, both of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/644,542

(22) Filed: Aug. 24, 2000

(30) Foreign Application Priority Data

Mar. 28, 2000 (JP) .................................................. 12-088625

(51) Int. Cl.[7] .............................. H02M 5/447; H03K 5/22
(52) U.S. Cl. ................................... 363/39; 327/68; 327/79
(58) Field of Search .................................... 363/39, 40, 41; 323/299, 300; 327/68, 69, 77, 78

(56) References Cited

U.S. PATENT DOCUMENTS

| | | | |
|---|---|---|---|
| 4,068,138 | * | 1/1978 | Miyakawa et al. ................... 327/354 |
| 4,169,232 | * | 9/1979 | Henrich .................................. 327/79 |
| 4,348,596 | * | 9/1982 | Atherton et al. ..................... 326/107 |
| 5,019,722 | * | 5/1991 | Hess et al. ............................ 327/79 |
| 5,166,550 | * | 11/1992 | Matsubara et al. .................... 327/68 |

* cited by examiner

Primary Examiner—Rajankani B. Patel
(74) Attorney, Agent, or Firm—Jones Volentine, PLLC

(57) ABSTRACT

There is provided an input circuit with reduced electrical power consumption, which processes an input signal given thereto for removing the noise components contained therein and regulating the voltage level thereof as well, and then supplies an output signal therefrom to a subsequent semiconductor integrated circuit. The input circuit 101 is made up of the Schmitt buffer 111, a pull-down resistance 113, an N-transistor 115, a P-transistor 121, an N-transistor 122, a P-transistor 131, an N-transistor 132, an exclusive OR gate 141, and a bus driver 151. The Schmitt buffer 111 is a buffer which has two threshold levels i.e. upper and lower thresholds, and changes the level of the output signal OUT depending on whether the voltage of an input signal IN is higher or lower than these two threshold levels.

13 Claims, 5 Drawing Sheets

INPUT CIRCUIT

BACKGROUND OF THE INVENTION

1. Field of the Invention

The present invention relates to an input circuit and, more particularly, to an input circuit of the class which processes a given input signal to remove the noise components contained therein and to regulate the voltage level thereof, and then supplies the processed as an output signal of the input circuit to a subsequent semiconductor integrated circuit.

2. Prior Art

As indicated in FIG. 5, a prior art input circuit 1 for use in a semiconductor integrated circuit is made up of a Schmitt buffer 11, a pull-down resistance 13, and an N-channel type transistor (referred to as just "N-transistor" hereinafter) 15.

The Schmitt buffer 11 is such a buffer that has two threshold levels i.e. an upper threshold level and a lower one and varies the level of its output signal OUT depending on whether the voltage of an input signal IN exceeds the above two threshold levels, that is, whether the voltage of the input signal IN is higher than the upper threshold level or lower than the lower the threshold level. When the voltage of the input signal IN is lower than the lower threshold level, the corresponding output signal OUT is made to be a logical low level (referred to as "L-level" hereinafter), and when the voltage of the input signal IN which is higher than the upper threshold level, the corresponding output signal OUT is made to be a logical high level (referred to as "H-level" hereinafter). In the following, the above prior art input circuit will be discussed assuming that the input signal IN inputted to the first node N1 is either at the H-level or in the high impedance state (referred to as "HiZ" hereinafter).

The Schmitt buffer 11 is made up of 4 P-channel type transistors (referred to as just "P-transistor" hereinafter) 11-1, 11-3, 11-5 and 11-7, and 4 N-transistors 11-2, 11-4, 11-6 and 11-8.

Each gate of the P-transistor 11-1 and the N-transistor 11-2 is commonly connected with the first node N1 to which the input signal IN is externally inputted, and each drain of them is commonly connected with the second node N2. The source of the P-transistor 11-1 is connected with a power source VDD, and the source of the N-transistor 11-2 is connected with the ground GND.

Each gate of the P-transistor 11-3 and the N-transistor 11-4 is commonly connected with the third node N3 from which the output signal OUT is put out, and each drain of them is commonly connected with the second node N2. The source of the P-transistor 11-3 is connected with the drain of the P-transistor 11-5, and the source of the N-transistor 11-4 is connected with the drain of the N-transistor 11-6.

Each gate of the P-transistor 11-5 and the N-transistor 11-6 is commonly connected with the first node Ni. The source of the P-transistor 11-5 is connected with a power source VDD, and the source of the N-transistor 11-6 is connected with the ground GND.

Each gate of the P-transistor 11-7 and the N-transistor 11-8 is commonly connected with the second node N2, and each drain of them is commonly connected with the third node N3. The source of the P-transistor 11-7 is connected with a power source VDD, and the source of the N-transistor 11-8 is connected with the ground GND.

One end of the pull-down resistance 13 is connected with the ground GND, and the other end thereof is connected with the source of an N-transistor 15. The drain of the N-transistor 15 is connected with the first node N1. The N-transistor 15 is controlled to be turned on or off by means of a pull-down selection signal PUDN inputted to the gate thereof.

When the pull-down resistance selection signal PUDN of the H-level is inputted to the prior art input circuit 1 as made up like the above, the N-transistor 15 is turned on, so that the first node N1 is pulled down to the potential of the ground GND by the N-transistor 15 and the pull-down resistance 13. Contrary to this, when the pull-down resistance selection signal PUDN of the L-level is inputted, the N-transistor 15 is turned off, so that the first node N1 is electrically separated from the ground GND.

By the way, according to the prior art input circuit 1, however, when the pull-down resistance selection signal is at the H-level, if the H-level input signal IN is inputted to the first node N1, the current I1 is caused to flow through the N-transistor 15 and the pull-down resistance 13 as well. It is needed, therefore, to minimize such current I1 in order to achieve the reduction of electric power consumption in the input circuit 1.

Then, for meeting this need, it might be considered to electrically separate the first node N1 from the ground GND, thereby preventing the current I1 from flowing through the N-transistor 15 and the pull-down resistance 13. More specifically, for a period of time during which there is no need for the input circuit 1 to generate any output signal OUT in response to the input signal IN, in other words, a subsequent circuit of the input circuit 1 does not require any output signal OUT received thereby, if the pull-down resistance selection signal PUDN be the L-level and the N-transistor 15 be in the OFF state, the first node N1 can be electrically separated from the ground GND. With this, the current I1 can be prevented from flowing through the N-transistor 15 and the pull-down resistance 13 even if the input signal IN is at the H-level.

If, however, the input signal IN gets in the HiZ state in the condition that the first node N 1 is electrically separated from the ground GND, the first node Ni will become an unstable intermediate level, which is neither the H-level nor the L-level. In this state, both of the P-transistor 11-1 and the N-transistor 11-2 equipped in the Schmitt buffer 11 will fall into the incomplete state i.e. neither ON nor OFF state, and there will be generated a so-called penetration current I2 flowing between the source of the P-transistor 11-1 and the drain of the N-transistor 11-2. This penetration current I2 is also against the reduction of electric power consumption in the input circuit 1.

The invention has been made in view of such problems as described above, and its main object is to provide an input circuit with smaller electric power consumption.

SUMMARY OF THE INVENTION

In order to solve the problems as described above, according to the invention, there is provided an input circuit which generates an output signal at an output node in response to an input signal received at an input node, and supplies the output signal to an internal circuit in accordance with an input/output control signal of the enable state. This input circuit is characterized by that it is made up of: a first voltage level production section which has an input terminal, an output terminal, a first power source terminal, and a second power source terminal, produces a first voltage level, in response to the voltage level of the input node, based on a voltage level applied to the first power source terminal and a voltage level applied to the second power source terminal as well, and supplies the first voltage level to an intermediate node; a second voltage level production section which produces a second voltage level in response to the voltage level of the intermediate node, and supplies the second voltage level to the output node; a voltage level comparison section which detects whether or not the voltage level of the output node coincides with the voltage level of the input/output control signal, and outputs a detection signal in correspondence with a detection result; a voltage level holding section which holds a voltage level of the output node given at the time when said input/output control signal changes the state thereof from the enable state to the disable state; and a power source terminal selection section which makes either the first or second power source terminal of the first voltage level production section be in the high impedance state according to said detection signal outputted from the voltage level comparison section. When either the first or the second power source terminal of the first voltage level production section is made to be in the high impedance state by the power source terminal selection section, there is no chance for any current to be generated and flow between the first and second power source terminal, thus the invention realizing the reduction of electric power consumption in the input circuit.

The input circuit is preferably provided with the input node voltage regulation circuit which pulls up or pulls down the input node based on the input/output control signal. With addition of this circuit to the input circuit, it becomes possible to pull up or pull down the input node in response to the input signal. Moreover, since pulling up or pulling down of the input node may be executed as the need arises, the electric power consumption in the input node voltage regulation circuit can be also reduced.

The voltage level holding section indirectly holds the voltage level of the output node by holding the voltage level of the intermediate node.

With provision of the driver circuit which is controlled by the input/output control signal to supply the output signal to the internal circuit, it becomes possible to supply the output signal to the internal circuit at a predetermined timing and also for a predetermined period of time.

With provision of the latch circuit which holds a voltage level of the output node given at the time when the input/output control signal changes the state thereof from the enable state to the disable state, it becomes possible to supply the output signal to the internal circuit at a predetermined timing and also for a predetermined period of time. A clock signal may be used as an input/output control signal.

The voltage level comparison section may be formed by using an exclusive OR gate.

BRIEF DESCRIPTION OF THE DRAWINGS

The invention will now be described in detail by way of some preferred embodiments according to the invention with reference to the accompanying drawings. In the following description and the accompanying drawings, in order to avoid the repetitive and redundant description, constituents of the invention having the almost same function and structure will be designated by like reference numerals and characters. In the accompanying drawings.

PREFERRED EMBODIMENTS OF THE INVENTION

Figure 1:
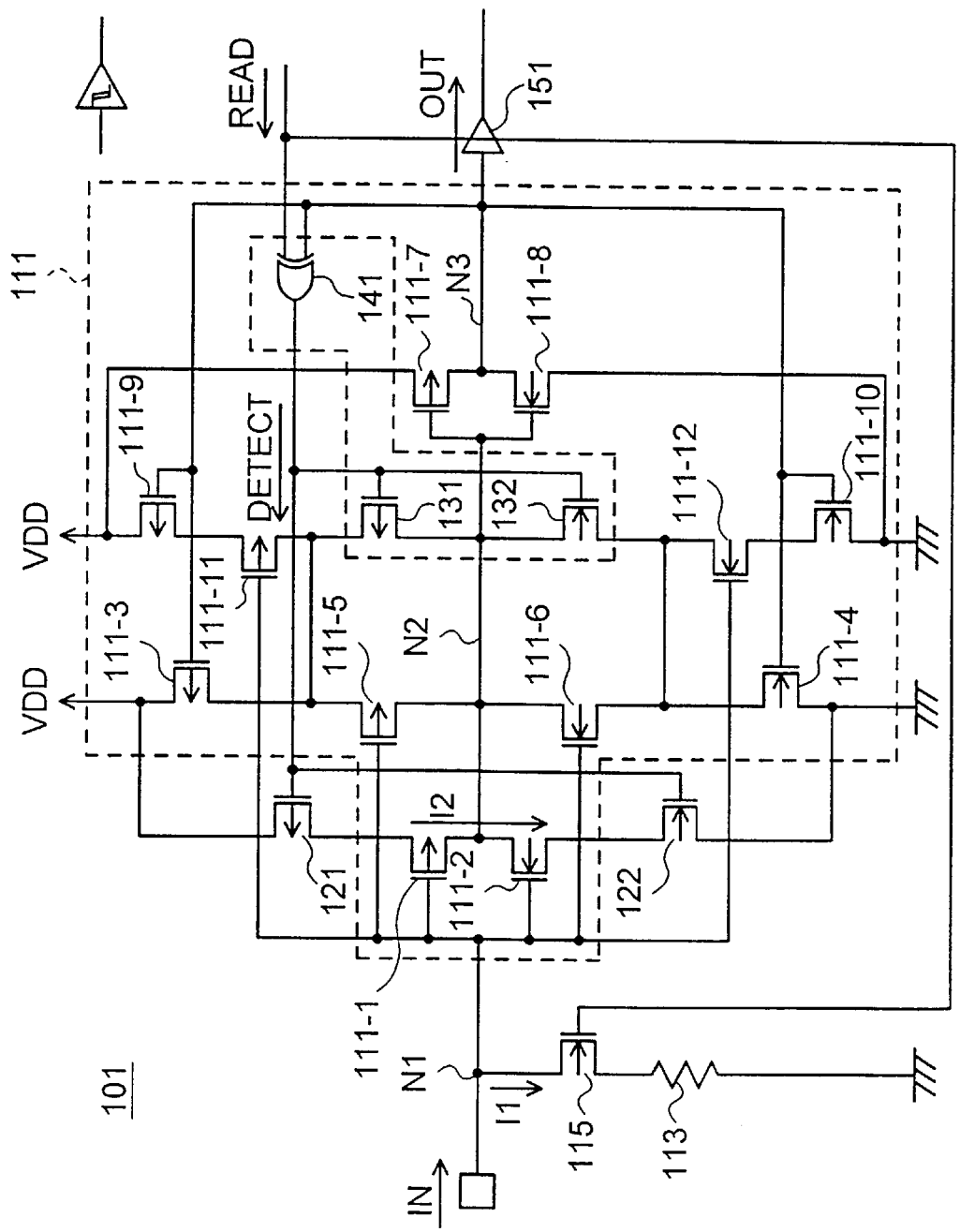
FIG. 1 is a circuit diagram of an input circuit according to the invention.

FIG. 1 shows a circuit arrangement with respect to an input circuit 101 according to one embodiment of the invention. This input circuit 101 is made up of a Schmitt buffer 111, a pull-down resistance 113, an N-transistor 115, a P-transistor 121, an N-transistor 122, a P-transistor 131, an N-transistor 132, an exclusive OR gate (referred to as "ExOR" hereinafter) 141 as a voltage comparison section, and a bus driver 151 as a driver circuit.

In the above input circuit 101, the P-transistor 131 and the N-transistor 132 serve as a voltage level holding section, and the P-transistor 121 and the N-transistor 122 serve as a power source terminal selection section. Furthermore, the pull-down resistance 113 and the N-transistor 115 serve as an input node voltage regulating section.

Similar to the Schmitt buffer 11 equipped in the above-mentioned prior art input circuit 1, the Schmitt buffer 111 has two threshold levels i.e. an upper threshold level and a lower one, and it varies the level of its output signal OUT depending on whether the voltage of an input signal IN exceeds the above two threshold levels More specifically, when the voltage of an input signal IN is lower than the lower threshold level, the output signal OUT is made to be the L-level, and when the voltage of an input signal IN is higher than the upper threshold level, the output signal OUT is made to be the H-level. In the following, the embodiment of the invention will be described with respect to the case where the input signal IN inputted to the first node N1 as an input node is either at the H-level or in the HiZ state.

The Schmitt buffer 111 is made up of 6 P-transistors 111-1, 111-3, 111-5, 111-7, 111-9 and 111-11, and 6 N-transistors 111-2, 111-4, 111-6, 111-8, 111-10 and 111-12.

In the Schmitt buffer 111, the P-transistor 111-1 and the N-transistor 111-2 form the first voltage level production section. Both gates of the P-transistor 111-1 and the N-transistor 111-2 serve as a input terminal, and the source of the P-transistor 111-1 serves as the first power source terminal, and the source of the N-transistor 111-2 serves as the second power source terminal. The P-transistor 111-7 and the N-transistor 111-8 form the second voltage level production section.

Each gate of the P-transistor 111-1 and the N-transistor 111-2 is commonly connected with the first node NI to which the input signal IN is inputted and each drain of these transistor is commonly connected with the second node N2 as an intermediate node. The source of the P-transistor 111-1 is connected with the drain of the P-transistor 121, and the source of the N-transistor 111-2 is connected with the drain of the N-transistor 122.

Each gate of P-transistors 111-3 and 111-9, and of N-transistor 111-4 and 111-10 is commonly connected with the third node N3 as an output node from which the output signal OUT is put out. Each source of P-transistors 111-3 and 111-9 is connected with a power source VDD, and each source of N-transistor 111-4, 111-10 is connected with the ground GND.

The drain of the P-transistor 111-3 is connected with each source of P-transistors 111-5 and 131 and with the drain of P-transistor 111-11. The drain of the P-transistor 111-9 is connected with the source of the P-transistor 111-11.

The drain of the N-transistor 111-4 is connected with each source of N-transistors 111-6 and 132, and with the drain of the N-transistor 111-12. The drain of the N-transistor 111-10 is connected with the source of the N-transistor 111-12.

Each gate of P-transistors 111-5 and 111-11, and of N-transistors 111-6 and 111-12 is commonly connected with the first node N1. Each drain of the P-transistor 111-5 and the N-transistor 111-6 is commonly connected with the second node N2.

Each gate of the P-transistor 111-7 and the N-transistor 111-8 is commonly connected with the second node N2, and each drain of these transistors is commonly connected with the third node N3. The source of the P-transistor 111-7 is connected with the power source VDD, and the source of the N-transistor 111-8 is connected with the ground GND.

One end of the pull-down resistance 113 is connected with the ground GND, and the other end thereof is connected with the source of the N-transistor 115. The drain of the N-transistor 115 is connected with the first node N1. This N-transistor 115 is controlled to be turned on/off by a data read control signal READ, which is inputted to the gate of this transistor as a control signal.

Each gate of P-transistors 121 and 131, and of N-transistors 122 and 132 is connected with the output terminal of the ExOR gate 141. The source of the P-transistor 121 is connected with the voltage VDD, and the source of the N-transistor 122 is connected with the ground GND. Each drain of the P-transistor 131 and the N-transistor 132 is commonly connected with the second node N2.

The ExOR gate 141 is arranged such that its first input terminal is connected with the third node N3 and the data read control signal READ is inputted to the second input terminal thereof.

The bus driver 151 is provided, for instance, when the input circuit 101 is connected with a data bus (not shown) which is provided as an internal circuit. The output signal OUT from the input circuit 101 is supplied to the data bus at a predetermined timing through the bus driver 151 which is controlled by the data read control signal READ.

The operation of the input circuit 101 constructed as above according to the embodiment of the invention will now be described in the following.

In order to read the input signal IN and supply it to the subsequent data bus, the data read control signal READ of the H-level is inputted to the input circuit 101.

When the data read control signal READ of the H-level is inputted to the input circuit 101, the N-transistor 115 is turned on, so that the first node N1 is connected with the ground GND through both of the N-transistor 115 and the pull-down resistance 113. That is, the first node N1 is pulled down. At this time, the bus driver 151 is also turned on, so that the output signal OUT from the Schmitt buffer 111 is supplied to the subsequent data bus.

Contrary to this, if the output signal OUT is not required to be supplied to the data bus (including the case that the output signal supply is prohibited), the data read control signal READ is made to be the L-level. When the data read control signal READ becomes the L-level, the bus driver 151 is turned off, and the output signal OUT can not be supplied to the data bus. Furthermore, since the N-transistor 115 is turned off, the first node N1 is electrically separated from the ground GND, so that there can not be generated any current I1 flowing from the first node N1 to the ground GND. In this way, according to the input circuit 101 as described above, since node N1 is pulled down only when the output signal OUT generated by reading the input signal IN is required to be supplied to the subsequent circuit, the value of the current I1 consumed per unit time (average current value) can be reduced to a great extent comparing with the prior art input circuit, thus the reduction of electric power consumption being realized.

For a period of time during which the first node NI is connected with the ground GND through the N-transistor 115 and the pull-down resistance 113 by inputting the data read control signal READ of the H-level to the input circuit 101, if the input signal IN is at the H-level, the first node N1 becomes the H-level, and if the input signal IN is in the HiZ state, the first node Ni becomes the L-level. That is, the first node N1 can not become any unstable intermediate level, so that it never happens that any large penetration current I2 is generated in the Schmitt buffer 111.

Figure 2:
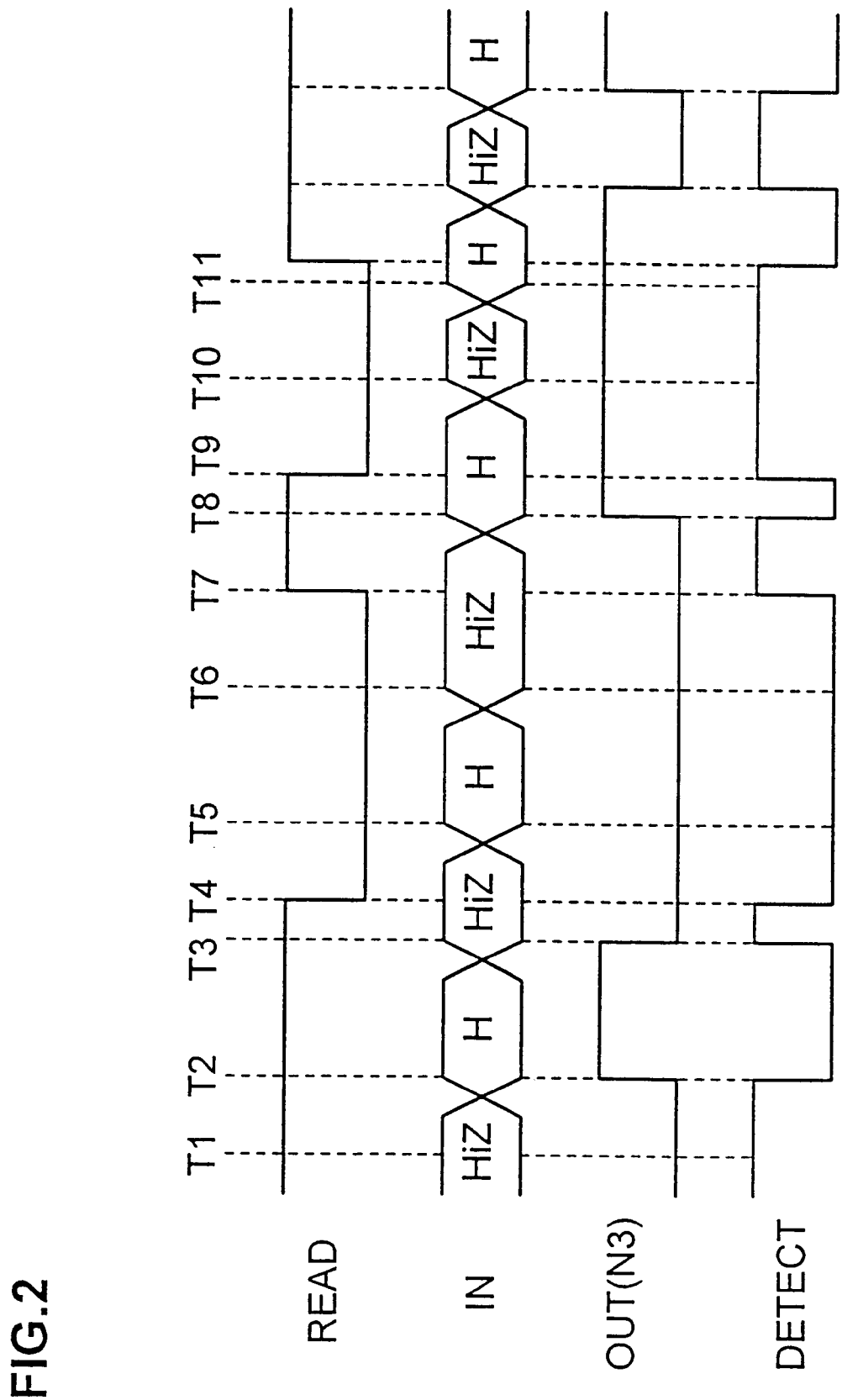
FIG. 2 is a timing chart for use in explaining the operation of the input circuit as shown in FIG. 1.

As previously discussed, however, in case of such a circuit construction as adopted by the prior art input circuit 1, if the first node N1 is electrically separated from the ground GND and the input signal IN is of high impedance (HiZ), the first node N1 becomes the intermediate level, thereby the penetration current I2 being generated in the Schmitt buffer 11. However, with the input circuit 101 according to the embodiment of the invention, not only the current I1 can be minimized but also generation of the penetration current I2 in the Schmitt buffer 111 can be prevented. In the following, how the input circuit 101 operates to prevent generation of the penetration current I2 will be described in detail with reference to FIG. 2.

At the time T1 the data read control signal READ is at the H-level and the input signal IN is in the HiZ state, since the first node N1 is pulled down, the second node N2 becomes the H-level, and the output signal OUT of the L-level is outputted from the third node N3. This output signal OUT of the L-level is supplied to the data bus through the bus driver 151.

Then, the ExOR gate 141 receives the output signal OUT of the L-level through its first input terminal and also receives the data read control signal READ of the H-level through its second input terminal. Consequently, the ExOR gate 141 detects that both of the received signals fail to coincide with each other in their logical levels and then, it puts out a detection signal DETECT of the H-level.

The detection signal DETECT of the H-level is then inputted to each gates of P-transistors 121 and 131, and of N-transistors 122 and 132, so that P-transistors 121 and 131 are turned off, and N-transistors 122 and 132 are turned on.

Furthermore, the output signal OUT of the L-level is inputted to each gate of P-transistors 111-3 and 111-9, and of N-transistors 111-4 and 111-10, so that P-transistors 111-3 and 111-9 are turned on, and N-transistors 111-4 and 111-10 are turned off.

At the time T2, when the level of the input signal IN changes to the H-level, the first node N1 makes a level transition from the L-level to the H-level. With this, P-transistors 111-1, 111-5 and 111-11 are turned off, and N-transistors 111-2, 111-6 and 111-12 are turned on. Then, the second node N2 is connected with the ground GND through the N-transistor 111-2 and the N-transistor 122, thereby its level being changed from the H-level to the L-level. As the result of this, the third node N3 comes to put out the output signal OUT of the H-level, which in turn, is supplied to the data bus through the bus driver 151.

Then, since the ExOR gate 141 receives the input signal OUT of the H-level at its first input terminal and also receives the data read control signal READ of the H-level at its second input terminal, both of signals received by the ExOR 141 coincide with each other in their logical levels, thus outputting the detection signal DETECT of the L-level.

This detection signal DETECT of the L-level is then inputted to each gates of P-transistors 121 and 131, and of N-transistors 122 and 132, so that P-transistors 121 and 131 are turned on, and N-transistors 122 and 132 are turned off.

Furthermore, the output signal OUT of the H-level is inputted to each gate of P-transistors 111-3 and 111-9, and of N-transistors 111-4 and 111-10, so that P-transistors 111-3 and 111-9 are turned off, and N-transistors 111-4 and 111-10 are turned on.

When the input signal IN is changed to the H-level at the time of T2, the N-transistor 122 among N-transistors 111-2 and 122 connecting the second node N2 with the ground GND, is turned off, but instead, both of N-transistors 111-4 and 111-10 are turned on, so that these and N-transistors 111-6 and 111-12 can still connect the second node N2 with the ground GND and hold it at the L-level.

At the time T3, when the state of the input signal IN is changed to the HiZ state, the first node N1 is pulled down to the ground GND by the pull-down resistance 113 and the N-transistor 115 as well, so that the first node N1 changes its the logical level from the H-level to the L-level. With this, P-transistors 111-1, 111-5 and 111-11 are turned on, and N-transistors 111-2, 111-6 and 111-12 are turned off. Then, the second node N2 is connected with the power source VDD through the P-transistor 111-1 and the N-transistor 121, so that the second node N2 changes its logical level from the L-level to the H-level. As the result of this, the third node N3 puts out the output signal OUT of the L-level, which in turn is supplied to the data bus by means of the bus driver 151.

Then, the ExOR gate 141 receives the output signal OUT of the L-level through its first input terminal and also receives the data read control signal READ of the H-level through its second input terminal. Consequently, the ExOR gate 141 detects that both of the received signals fail to coincide with each other in their logical levels and then, it puts out a detection signal DETECT of the H-level.

This detection signal DETECT of the H-level is then inputted to each gate of P-transistors 121 and 131 and of N-transistors 122 and 132, so that P-transistors 121 and 131 are turned off and N-transistors 122 and 132 are turned on.

Furthermore, the output signal OUT of the L-level is inputted to each gate of P-transistors 111-3 and 111-9, and of N-transistors 111-4 and 111-10, so that P-transistors 111-3 and 111-9 are turned on, and N-transistors 111-4 and 111-10 are turned off.

When the input signal IN is changed to be in the HiZ state at the time of T3, the P-transistor 121 among P-transistors 111-1 and 121 connecting the second node N2 with the power source VDD, is turned off, but instead, both of P-transistors 111-3 and 111-9 are turned on, so that these and P-transistors 111-5 and 111-11 can still connect the second node N2 with the power source VDD and hold it at the H-level.

At the time T4, the data read control signal READ is changed from the H-level to the L-level. With this, the bus driver 151 cuts off the supply of the output signal OUT from the input circuit 101 to the data bus. Furthermore, the N-transistor 115 is turned off and the first node N1 is electrically separated from the ground GND. Since the input signal IN is in the HiZ state at this stage, the first node NI becomes the unstable intermediate level, so that both of the P-transistor 111-1 and the N-transistor 111-2 fall into the incomplete ON or OFF state.

The ExOR gate 141 receives the input signal OUT of the L-level at its first input terminal and also receives the data read control signal READ of the L-level at its second input terminal. Accordingly, since both of signals received by the ExOR 141 coincide with each other in their logical levels, the ExOR 141 puts out the detection signal DETECT of the L-level.

Then, this detection signal DETECT of the L-level is inputted to each gate of P-transistors 121 and 131, and of N-transistors 122 and 132, thereby P-transistors 121 and 131 being turned on, and N-transistor 122 and 132 being turned off. Consequently, even though both of the P-transistor 111-1 and the N-transistor 111-2 are in the incomplete ON or OFF state, the N-transistor 122 can be in the complete OFF state, so that there is no chance for the penetration current I2 to be generated.

Furthermore, the input signal OUT of the L-level is continuously inputted to each gate of the P-transistor 111-3 and the N-transistor 111-4, so that the P-transistor 111-3 is held in the ON state and the N-transistor 111-4 is held in the OFF state, respectively. Accordingly, even if the first node N1 is in the unstable intermediate level, the second node N2 is connected with the power source VDD by means of the P-transistor 131 and the P-transistor 111-3 as well, thereby being held in the state immediately before the time T4, that is, at the L-level. Thus, the output signal OUT also holds its logical level immediately before the time T4, that is, the L-level.

At the time T5, when the input signal IN is changed to the H-level, the first node N1 becomes the H-level and all of N-transistors 111-2, 111-6 and 111-12 are turned on. However, since N-transistors 122, 111-4 and 111-10, 132 have been already turned off before the time T5, the second node N2 is not connected with the ground GND and is still holding the H-level.

The second node N2 can also hold the H-level even after the input signal IN has been changed to the HiZ state at the time T6. At this stage, although the first node N1 becomes the unstable intermediate level and both of the P-transistor 111-1 and the N-transistor 111-2 fall into the incomplete ON or OFF state, the N-transistor 122 can be in the complete OFF state, so that there is no chance for the penetration current I2 to be generated.

The second node N2 can change its logical level to the H-level or L-level in response to the voltage level of the input signal IN only when the data read control signal READ is changed to the H-level at the time T7 and the first node N1 is pulled down, and thereafter.

When the input signal IN is changed to the H-level at the time T8, the second node N2 is changed from the H-level to the L-level, in response to which the output signal OUT becomes the H-level.

When the data read control signal READ is again changed to the L-level at the time T9, P-transistors 121, 131, 111-3 and 111-9 are turned off, and N-transistors 122, 132, 111-4 and 111-10 are turned on.

When the input signal IN is changed to be in the HiZ state at the time T10, the first node N1 becomes the unstable intermediate level, thereby both of the P-transistor 111-1 and the N-transistor 111-2 falling into the incomplete ON or OFF state. However, since the P-transistor 121 is held in the complete OFF state, there is no chance for the penetration current I2 to be generated. On one hand, the second node N2 is connected with the ground GND through N-transistors 111-4 and 132, thus its L-level being held.

Furthermore, when the input signal IN is changed to the H-level at the time T11, N-transistors 111-2, 111-6 and 111-12 are turned on, so that the second node N2 is connected with the ground GND through this N-transistor 111-2 and the N-transistor 122, and the N-transistor 111-6 and N-transistors 111-4, 111-12 and 111-10. However, the second node N2 has been already connected with the ground GND through N-transistors 132 and 111-4 prior to the time T11, thus being held in the L-level regardless of the logical level of the input signal IN.

As has been discussed, in the input circuit 101 according to the embodiment of the invention, when the data read control signal READ is made to be the L-level for the purpose of reduction of the current I1 flowing the first node N1 to the ground GND, either the P-transistor 121 or the N-transistor 122 never fails to be in the OFF state, so that even if the input signal IN is in the HiZ state, there is no chance for the penetration current I2 to be generated in the Schmitt buffer 111.

Furthermore, the voltage level of the second node N2 at the time when the data read control signal READ is at the L-level, is held at the voltage level that is given at the time when the logical level of the data read control signal READ has been changed from the H-level to the L-level by the P-transistor 131 and the N-transistor 132. Therefore, for a period of time during which the data read control signal READ is held at the L-level, the voltage level of the detection signal DETECT put out from the ExOR gate 141 is held either at the H-level or at the L-level, regardless of the input signal IN being at the H-level or in the HiZ state, so that the P-transistor 121 and N-transistor 122 do not switch their ON/OFF states. Accordingly, while the data read control signal READ is at the L-level, the P-transistor 121 and the N-transistor 122 never fall into the incomplete ON or OFF state which is apt to be caused during the switching from the ON state to the OFF state or vice versa. As the result of this, it is surely prevented that the penetration current I2 is generated.

Figure 3:
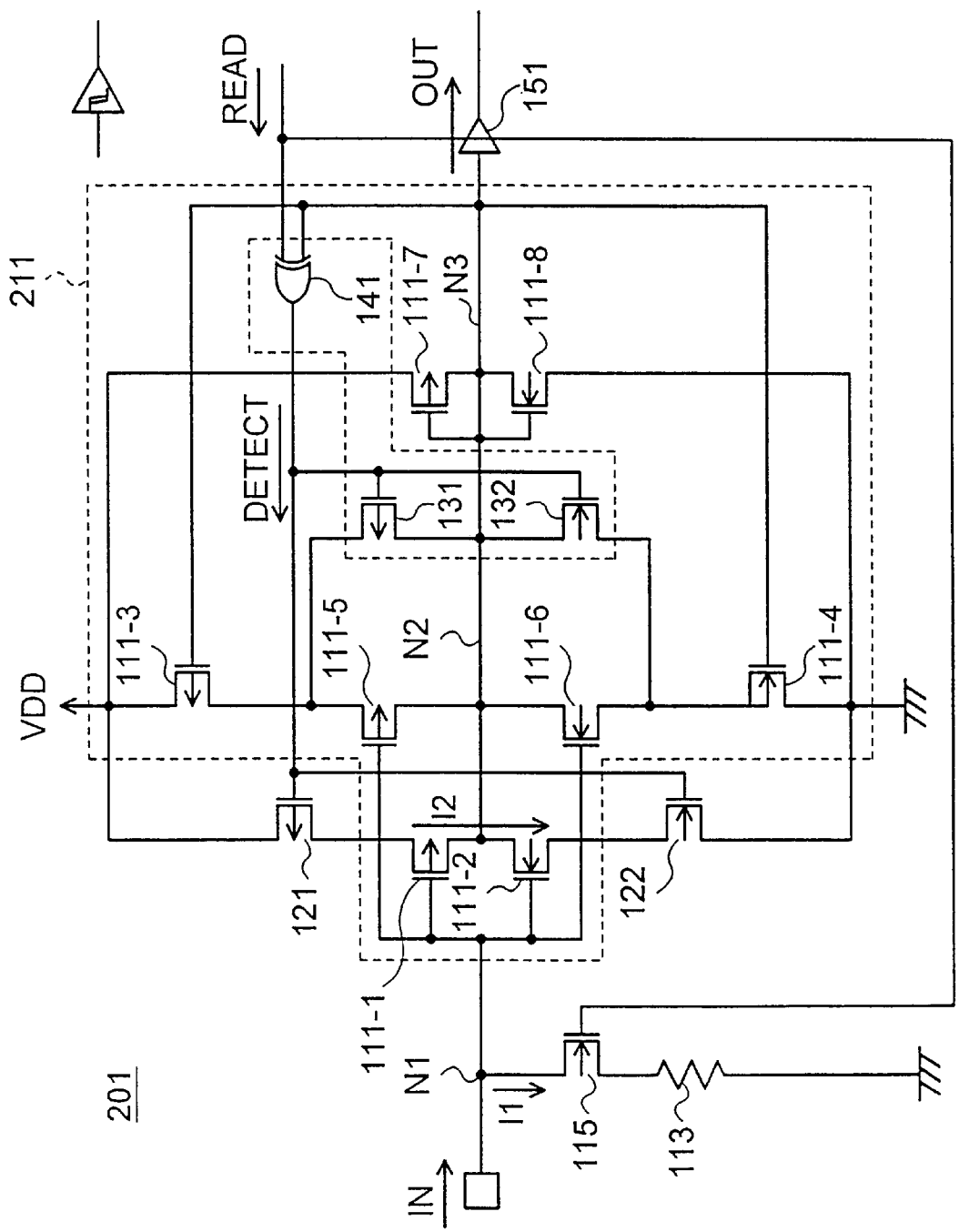
FIG. 3 is a circuit diagram of another input circuit according to the invention.

By the way, the Schmitt buffer 111 provided in the input circuit 101 may be replaced by a Schmitt buffer 211 shown in FIG. 3. This Schmitt buffer 211 has such a structure that is formed by removing P-transistors 111-9 and 111-11 and N-transistors 111-10 and 111-12 from the Schmitt buffer 111. An input circuit 201 provided with the Schmitt buffer 211 has an almost identical function with respect to generating the output signal OUT based on the input signal IN. Again, this input circuit 201 makes it possible to minimize the current I1 and also to prevent the penetration current I2 from being generated.

Figure 4:
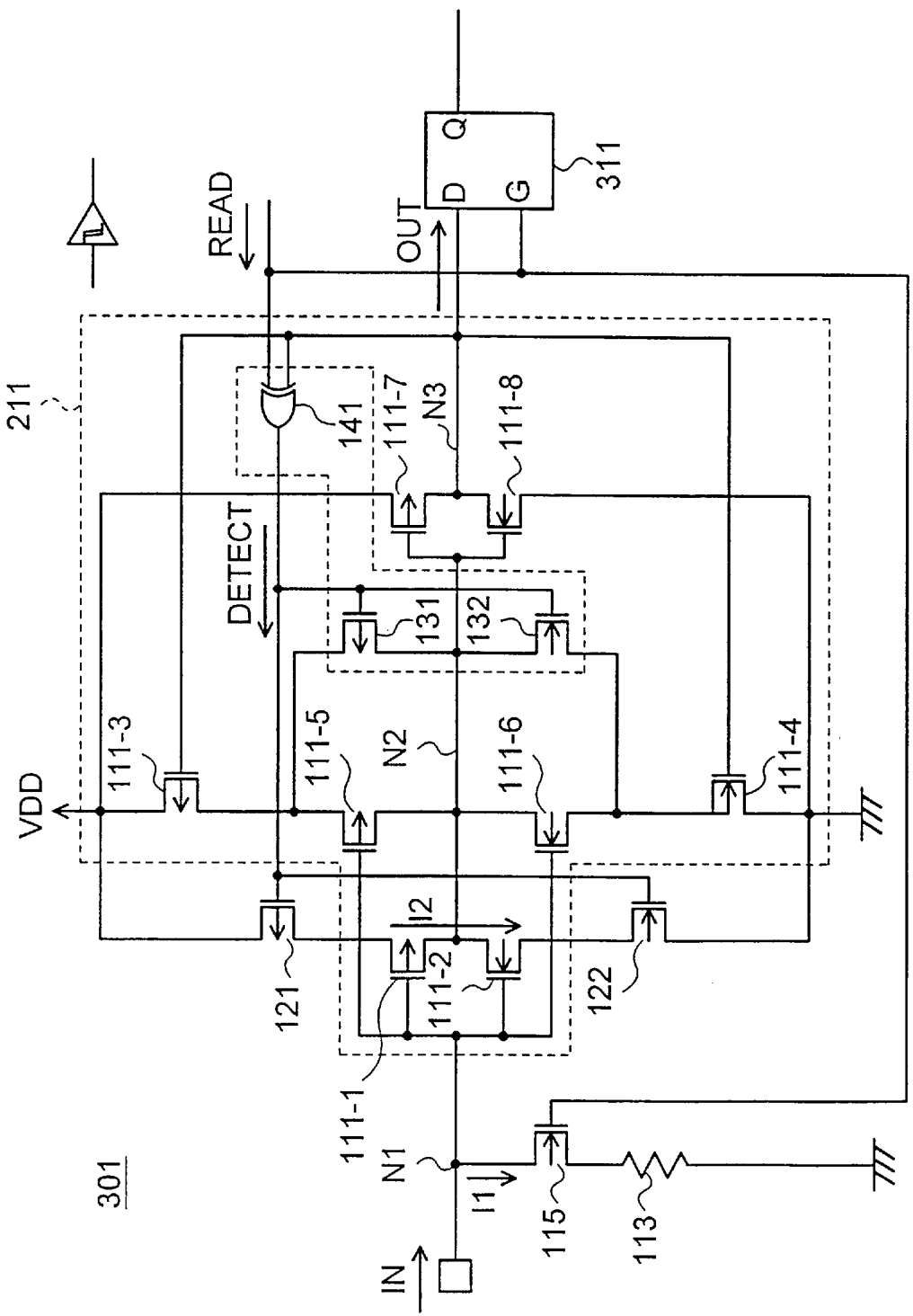
FIG. 4 is a circuit diagram of still another input circuit according to the invention.
Figure 5:
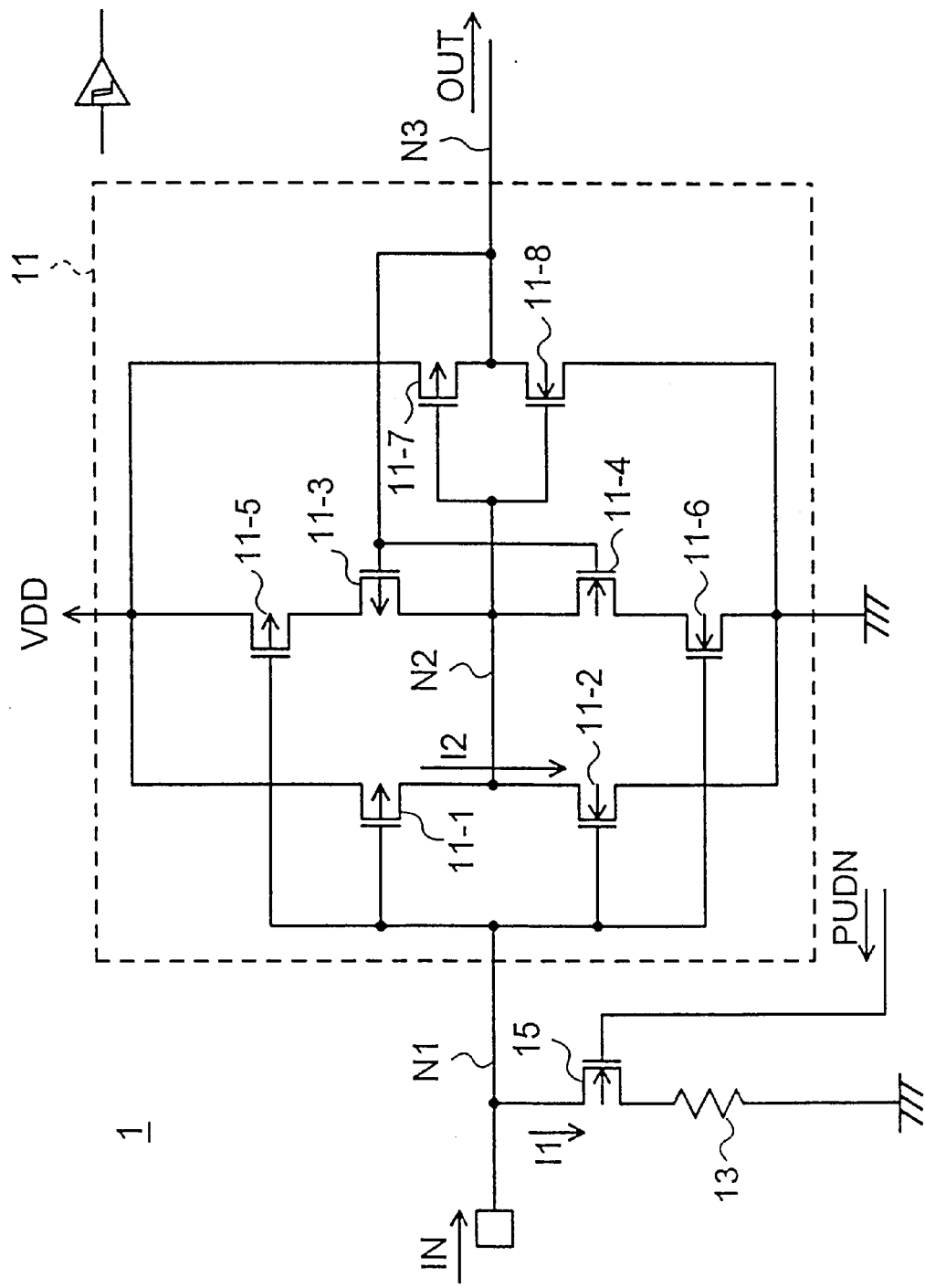
FIG. 5 is a circuit diagram of a prior art input circuit.

An input circuit 301 shown in FIG. 4 has such a structure that is formed by substituting a latch circuit 311 for the bus driver 151 of the input circuit 201 shown in FIG. 3. According to this input circuit 301, it becomes possible to minimize the current I1 and also to prevent the penetration current I2 from being generated. In this case, if a D-latch is used as the latch circuit 311 for instance, the output signal OUT of the input circuit 301 can be supplied to a subsequent circuit (for instance, a data bus) when the data read control signal READ is at the H-level, and the output signal OUT at the time when the data read control has been changed from H-level to the L-level, is held as it is by the latch circuit 311 as far as the data read control circuit READ stays at the L-level. The data read control circuit READ may be replaced by a signal, for instance a clock signal, of which the logical level periodically changes from the H-level to the L-level or vice versa.

The invention has been discussed in detail so far by way of some preferred embodiments according thereto with reference to the accompanying drawings. It should be noted, however, that the invention is not limited to those embodiments. It is apparent that anyone skilled in the art may make various changes and modifications in connection with the invention within the category of the technical thought as recited in the scope of claims for patent attached hereto, and it is understood that those changes and modifications should naturally be in the technical scope of the invention.

The above embodiments according to the invention have been discussed with respect to the case where the input signal IN is either at the H-level or in the HiZ state. However, the invention is applicable to the input circuit even in the case where the input signal IN is either at the L-level or in the HiZ state. In this case, input circuit 101, 201 and 301 are arranged such that the first node N1 is pulled up by a pull-up circuit which is controlled by the data read control signal READ.

As has been described so far, the invention makes it possible to reduce the power consumption in the input circuit, to remove noise components from the input signal, and further to supply a stable signal to a subsequent circuit.

The entire disclosure of Japanese Patent Application No. 2000-88625 filed on Mar. 28, 2000 including specification, claims, drawings and summary is incorporated herein by reference in its entirety.

What is claimed is:

1. An input circuit which generates an output signal at its output node based on an input signal received at its input node, and supplies said output signal to an internal circuit according to an input/output control signal of the enable state, comprising:

a first voltage level production section which has an input terminal, an output terminal, a first power source terminal, and a second power source terminal, and produces a first voltage level, in response to a voltage level applied to said input terminal connected with said input node, based on a voltage level applied to said first power source terminal and a voltage level applied to said second power source terminal as well, and further supplies said first voltage level to an intermediate node;

a second voltage level production section which produces a second voltage level in response to the voltage level of said intermediate node, and supplies said second voltage level to said output node;

a voltage level comparison section which detects whether or not the voltage level of said output node coincides with the voltage level of said input/output control signal, and outputs a detection signal in correspondence with a detection result;

a voltage level holding section which holds a voltage level of said output node given at the time when said input/output control signal changes the state thereof from the enable state to the disable state; and a power source terminal selection section which makes either the first or second power source terminal of said first voltage level production section be in the high impedance state according to said detection signal put out from said voltage level comparison section.

2. An input circuit as claimed in claim 1 further comprising an input node voltage regulation circuit for pulling up said input node based on said input/output control signal.

3. An input circuit as claimed in claim 2 wherein said input node voltage regulation circuit is made up of a resistance and a transistor which is controlled to be turned on or off by said input/output control signal, one end of said resistance is connected with a high voltage side power source terminal, the other end of said resistance is connected with one power source terminal of said transistor, and the other power source terminal of said transistor is connected with said input node.

4. An input circuit as claimed in claim 1 further comprising an input node voltage regulation circuit which pulls down said input node based on said input/output control signal.

5. An input circuit as claimed in claim 4 wherein said input node voltage regulation circuit is made up of a resistance and a transistor which is controlled to be turned on or off by said input/output control signal, one end of said resistance is connected with a low voltage side power source terminal, the other end of said resistance is connected with one power source terminal of said transistor, and the other power source terminal of said transistor is connected with said input node.

6. An input circuit as claimed in claim 1 wherein said voltage level holding section holds the voltage level of said output node by holding the voltage level of said intermediate node.

7. An input circuit as claimed in claim 1 further comprising a driver circuit which is controlled by said input/output control signal, to supply said output signal to said internal circuit.

8. An input circuit as claimed in claim 7 wherein said driver circuit is made up of a buffer with 3 states.

9. An input circuit as claimed in claim 1 further comprising a latch circuit which holds a voltage level of said output signal given at the time when said input/output control signal changes the state thereof from the enable state to the disable state.

10. An input circuit as claimed in claim 1 wherein said voltage level comparison section is made up of an exclusive OR gate.

11. An input circuit as claimed in claim 1 wherein said first voltage level production section comprises a P-channel transistor and an N-channel transistor, each gate of said P-channel transistor and said N-channel transistor is connected with said input terminal;

each drain of said P-channel transistor and said N-channel transistor is connected with said output terminal;

the source of said P-channel transistor is connected with said first power source terminal, and the source of said N-channel transistor is connected with said second power source terminal.

12. An input circuit as claimed in claim 1 wherein said second voltage level production section comprises a P-channel transistor and an N-channel transistor, each gate of said P-channel transistor and said N-channel transistor is connected with said intermediate node, each drain of said P-channel transistor and said N-channel transistor is connected with said output node, the source of said P-channel transistor is connected with said first power source terminal, and the source of said N-channel transistor is connected with said second power source terminal.

13. An input circuit as claimed in claim 1 wherein said power source terminal selection section comprises a P-channel transistor and an N-channel transistor, each gate of said P-channel transistor and said N-channel transistor is connected with the output terminal of said voltage level comparison section, the drain of said P-channel transistor is connected with the first power source terminal of said first voltage level production section, the drain of said N-channel transistor is connected with the second power source terminal of said first voltage level production section, the source of said P-channel transistor is connected with the first power source terminal, and the source of said N-channel transistor is connected with the second power source terminal.

* * * * *